United States Patent [19]

Rubin

[11] Patent Number: 4,683,569

[45] Date of Patent: Jul. 28, 1987

[54] DIAGNOSTIC CIRCUIT UTILIZING BIDIRECTIONAL TEST DATA COMPARISONS

[75] Inventor: Albert M. Rubin, West Milford, N.J.

[73] Assignee: The Singer Company, Stamford, Conn.

[21] Appl. No.: 789,528

[22] Filed: Oct. 21, 1985

[51] Int. Cl.⁴ .................... G01R 31/28; G06F 11/00
[52] U.S. Cl. ..................................... 371/25; 371/15; 371/68; 324/73 R
[58] Field of Search ...................... 371/20, 24, 25, 26, 371/67, 68, 69, 15, 16; 324/73 R

[56] References Cited

U.S. PATENT DOCUMENTS

| | | | |
|---|---|---|---|
| 3,582,633 | 6/1971 | Webb | 371/25 |
| 3,863,215 | 1/1975 | McGrogan | 371/69 |
| 4,257,031 | 3/1981 | Kirner | 371/24 X |
| 4,404,677 | 9/1983 | Grande | 371/69 |

*Primary Examiner*—Jerry Smith
*Assistant Examiner*—Robert W. Beausoliel, Jr.
*Attorney, Agent, or Firm*—David L. Davis

[57] ABSTRACT

Test points are connected in parallel to shift registers which are read out bidirectionally. Comparisons are then made of the data in each direction of shift and inconsistencies of the compared signals, from a reference data signal, cannot only indicate which test point has an error present thereat, but whether and which stage of a shift register employed in the present diagnostic system is inoperative.

4 Claims, 4 Drawing Figures

DIAGNOSTIC CIRCUIT UTILIZING BIDIRECTIONAL TEST DATA COMPARISONS

FIELD OF THE INVENTION

The present invention relates to diagnostic testing of digital equipment, and more particularly to such testing which is capable of detecting errors in the testing apparatus itself.

BACKGROUND OF THE INVENTION

Diagnostic testing of complex digital equipment is quite conventional. Typically, this involves the utilization of a global bus which services data distribution for the system as well as transmission of diagnostic data from system points to a CPU. The digital signals at test points are analyzed by the CPU; and when deviations are detected, the error-producing checkpoint may be found.

Although conventional diagnostic systems are capable of locating problem test points, they do require that the global bus of a digital system and the CPU be tied up for a period of time necessary to run diagnostic routines. Of course, this detracts from the data processing speed of the system.

Further, if the bus or CPU becomes temporarily inoperative, diagnostic testing of test points cannot be accomplished.

BRIEF DESCRIPTION OF THE INVENTION

The present invention solves the problems of the prior art by avoiding the necessity of using a digital system global bus for the system CPU to process diagnostic information.

The system of the present invention utilizes interconnected shift registers for accepting parallel data from test points. The contents of the shift registers are then read out serially in two separate sequences. These sequences correspond to bidirectional readout of the shift registers. The data read out from the shift registers during the bidirectional sequences are compared and such comparison yields information as to whether errors exist at any test point or if a problem exists with any bit of the shift registers. Accordingly, the present invention offers a self-checking diagnostic system, which does not require the global bus of the digital system which it is checking. Accordingly, the checked system may operate more rapidly. Further, if the global bus or CPU of the system being checked becomes temporarily inoperative, the test points may still be diagnosed.

BRIEF DESCRIPTION OF THE FIGURES

The above-mentioned objects and advantages of the present invention will be more clearly understood when considered in conjunction with the accompanying drawings, in which.

DETAILED DESCRIPTION OF THE INVENTION

Figure 1:
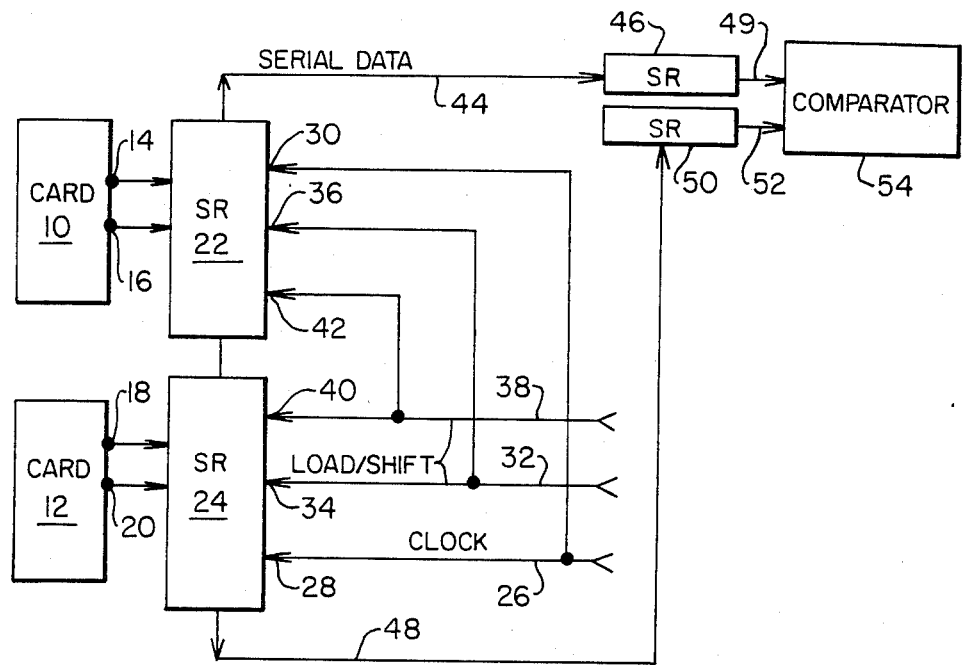
FIG. 1 is a block diagram of the present invention.

Referring to FIG. 1, cards 10 and 12 may represent circuit cards in a complex digital system. Test points 14 and 16 exist on card 10 while test points 18 and 20 exist on card 12. Diagnostic testing of cards 10 and 12 are accomplished by monitoring test points 14, 16, 18 and 20.

In order to do this, the outputs from the test points are connected to individual bit positions of serially connected shift registers 22 and 24. Particularly, test points 14 and 16 are connected to shift register 22 while test points 18 and 20 are connected to shift register 24.

Figure 2A:
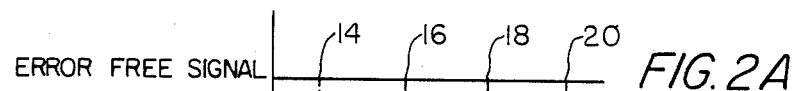
FIG. 2A is a timing diagram of an error-free signal at the test points to which the present invention is connected.

Conceptually, the data stored in shift registers 22 and 24 may all be binary zeros if the test points are error free, as indicated in FIG. 2A. The primary purpose of the shift registers 22 and 24 is to convert parallel data from test points 14, 16, 18 and 20 to serial data at line 44. In the event the serial data includes a binary one bit, it is an indication that one of the test points is not in an error-free condition. Since each test point relates to the bit positions in the serial data read from shift registers 22 and 24, the problem test point can be easily detected from an inspection of the serial data occurring on line 44. A clock is provided along line 26 to register inputs 28 and 30 to shift the data from the shift registers 22 and 24. A load signal along line 32 is connected to load terminals 34 and 36 of respective shift registers 24 and 22 to periodically load the parallel test point data from points 14, 16, 18 and 20 to the shift registers 22 and 24.

A significant aspect of the present invention is the ability of the system to check the operativeness of the shift registers 22 and 24. This is achieved by connecting an additional line 38 to input terminals 40 and 42 of respective shift registers 24 and 22. The two lines 32 and 38 are necessary to establish three separate binary states. The first state causes loading of test point data from cards 10 and 12 to the shift registers 22 and 24. During a second binary state, the data is shifted upwards so that it appears in serial form on line 44. A shift register 46 stores the serial data 44 from test points 14, 16, 18 and 20.

During a subsequent interval, lines 32 and 38 maintain a third binary state so that the contents of the shift registers 22 and 24 are shifted down along line 48. An additional shift register 50 stores the contents of the serial data appearing along line 48. The respective shift registers 46 and 50 have outputs 49 and 52 connected to a comparator 54. During normal operation of the invention, the outputs from 46 and 50 will be identical so that an exact comparison exists. However, in the event a bit in either shift register 22 or 24 is inoperative, and identity will not exist between the outputs of shift registers 46 and 50.

Figure 2B:
FIG. 2B is a timing diagram of the invention when an error is detected during a first bidirectional state of the inventive diagnostic system.

Assuming for a moment that the uppermost bit position of shift register 22 is inoperative, it will generate a series of binary ones even if the remaining test points are error free. This is illustrated in FIG. 2B.

Figure 2C:
FIG. 2C is a timing diagram of the invention when an error is detected during a second bidirectional state of the inventive diagnostic system.

However, when the serial registers are shifted down, each of the binary positions corresponding to test points will be at a binary zero state until the last bit is read out, which bit corresponds to the inoperative upper bit stored in shift register 22. The signals corresponding to FIGS. 2B and 2C are compared in comparator 54 and coincidence of the binary one in FIG. 2C and the fourth binary one bit of FIG. 2B pinpoint a problem with the uppermost binary bit position of shift register 22. In this manner the present diagnostic system is self checking.

Although the present invention has been explained in connection with two cards 10 and 12 and two shift registers 22 and 24, it should be understood that this is merely to simplify the explanation of the invention and the diagnostic system of the invention is expandable to handle a large number of test points on a large number of cards. The number of shift registers such as 22, 24 is not critical, all that is required is that the test point data be read in parallel from the test cards to the shift registers and converted to serial data for comparison.

It should be understood that the invention is not limited to the exact details of construction shown and described herein for obvious modifications will occur to persons skilled in the art.

I claim:

1. A system for diagnosing circuit test points comprising:

means for connecting digital test signals having signal levels from the test points to first storing means;

means for serially reading the digital signals from the first storing means;

first means for comparing the levels of the signals to predetermined levels indicative of error-free circuit operations;

wherein a difference between any bit of the serially read out signal and its predetermined level is indicative of an error at a test point location corresponding to the position of the bit in a serial data stream read from the first storing means, together with control means for bidirectionally shifting the contents of the first storing means to second comparing means for detecting faulty operation of a determinable stage of the first storing means, the faulty operation being determined from the output of the second comparing means.

2. The structure set forth in claim 1 wherein the first storing means comprises at least one shift register.

3. The structure set forth in claim 1 together with second and third storing means respectively storing the bidirectionally shifted contents of the first storing means, said second and third storing means having respective connections to said first storing means.

4. A method for diagnosing circuit test points comprising the steps:

reading digital test signals from the test points;

storing the read signals;

serially reading the digital signals from storage;

comparing the levels of the signals to predetermined levels indicative of error-free circuit operation;

wherein any bit of the serially read out signal corresponds to a respective test point location and wherein a difference between any bit of the serially read out signal and its predetermined level is indicative of an error at a test point location corresponding to the position of the bit in a serial data stream read from storage; together with the stop of bidirectionally shifting the contents from storage;

comparing the digital signals resulting from the bidirectional shift; and detecting, as a result of such comparison, faulty operation of a determinable bit of a stored read signal.

* * * * *